(12) United States Patent
Mrad et al.

(10) Patent No.: US 10,985,088 B2
(45) Date of Patent: Apr. 20, 2021

(54) SYSTEM COMPRISING AT LEAST ONE POWER MODULE COMPRISING AT LEAST ONE POWER DIE THAT IS COOLED BY LIQUID COOLED SYSTEM

(71) Applicant: MITSUBISHI ELECTRIC CORPORATION, Tokyo (JP)

(72) Inventors: Roberto Mrad, Rennes (FR); Stefan Mollov, Rennes (FR); Jeffrey Ewanchuk, Rennes (FR)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 366 days.

(21) Appl. No.: 16/090,859

(22) PCT Filed: Apr. 25, 2017

(86) PCT No.: PCT/JP2017/017324
§ 371 (c)(1),
(2) Date: Oct. 3, 2018

(87) PCT Pub. No.: WO2017/203960
PCT Pub. Date: Nov. 30, 2017

(65) Prior Publication Data
US 2020/0144156 A1    May 7, 2020

(30) Foreign Application Priority Data
May 24, 2016 (EP) .................................. 16171014

(51) Int. Cl.
*H01L 23/473*    (2006.01)
*H01L 25/07*    (2006.01)
(Continued)

(52) U.S. Cl.
CPC .......... *H01L 23/473* (2013.01); *H01L 25/072* (2013.01); *H01L 25/16* (2013.01); *H01L 25/18* (2013.01)

(58) Field of Classification Search
CPC .... H05K 7/20927; H05K 1/0203; H05K 7/02; H05K 7/2089; H05K 7/1432; H05K 7/20872
See application file for complete search history.

(56) References Cited

U.S. PATENT DOCUMENTS 5,111,280 A * 5/1992 Iversen ................. H01L 23/427
165/80.4
6,697,257 B1 * 2/2004 Wolf ................... H01L 23/5385
361/708
(Continued)

OTHER PUBLICATIONS

English translations of the Written Opinion of the International Searching Authority and International Search Report (forms PCT/ISA/237 and PCT/ISA/210) dated Sep. 5, 2017, for International Application No. PCT/JP2017/017324.

*Primary Examiner* — Binh B Tran
*Assistant Examiner* — Michael A Matey
(74) *Attorney, Agent, or Firm* — Birch, Stewart, Kolasch & Birch, LLP

(57) ABSTRACT

The present invention concerns a system comprising at least one power module comprising at least one power die that is cooled by a liquid cooled system, the liquid cooled system is arranged to provide at least one electric potential to each power dies of the power module, characterized in that the liquid cooled system is composed of a first and a second current-carrying bars connected together by an electrically non-conductive pipe, the first bar is placed on the top of the power module and provides a first electric potential to the power die and the second bar is placed on the bottom of the power module and provides a second electric potential to the (Continued)

power dies and the liquid coolant is electrically conductive and the channels surfaces are covered by an electrical insulation layer.

11 Claims, 4 Drawing Sheets

(51) Int. Cl.
    *H01L 25/18*         (2006.01)
    *H01L 25/16*         (2006.01)

(56) References Cited

U.S. PATENT DOCUMENTS

| | | | |
|---|---|---|---|
| 7,456,492 B2 * | 11/2008 | Mochida | H01L 23/4334 257/659 |
| 7,671,465 B2 * | 3/2010 | Funakoshi | H01L 25/071 257/706 |
| 8,988,860 B2 * | 3/2015 | Hammond | H05K 7/1432 361/614 |
| 9,198,332 B2 * | 11/2015 | Osada | H01L 24/40 |
| 9,497,873 B2 * | 11/2016 | Takagi | H01L 23/42 |
| 2005/0012206 A1 * | 1/2005 | Nakamura | H01L 23/4334 257/717 |
| 2007/0096278 A1 * | 5/2007 | Nakatsu | H01L 25/071 257/678 |
| 2007/0252169 A1 * | 11/2007 | Tokuyama | H01G 4/224 257/162 |
| 2011/0299265 A1 * | 12/2011 | Nakatsu | H05K 7/209 361/820 |
| 2017/0313159 A1 * | 11/2017 | Takagi | H02M 7/003 |

\* cited by examiner

SYSTEM COMPRISING AT LEAST ONE POWER MODULE COMPRISING AT LEAST ONE POWER DIE THAT IS COOLED BY LIQUID COOLED SYSTEM

TECHNICAL FIELD

The present invention relates generally to a system comprising at least one power module comprising at least one power die that is cooled by a liquid cooled system.

BACKGROUND ART

Traditional power converters include power semiconductors which are attached from the bottom side to a substrate, for example, a direct copper bonding (DCB) and are connected by wire bonding on the top side of the dies. This assembly is placed on a metallic base plate in order to spread the heat and then boxed into thermoplastic materials to protect from environmental stress. The obtained power module is attached on a bulky heat sink and the electrical connections are made thanks to a busbar.

SUMMARY OF INVENTION

Technical Problem

High power density in power electronic applications has always been a priority. With the emergence of wide band gap materials, the power modules have shrunk in size and the power density of power stages has increased. The increase of switching frequency also allows to reduce the size of passive components. However, this trend makes that the power modules have less room for heat sinks.

Solution to Problem

To that end, the present invention concerns a system comprising at least one power module comprising at least one power die that is cooled by a liquid cooled system, the liquid cooled system is arranged to provide at least one electric potential to each power dies of the power module, characterized in that the liquid cooled system is composed of a first and a second current-carrying bars connected together by an electrically non-conductive pipe, the first bar is placed on the top of the power module and provides a first electric potential to the power die and the second bar is placed on the bottom of the power module and provides a second electric potential to the power dies, the liquid coolant is electrically conductive and the channels surfaces are covered by an electrical insulation layer.

Thus, the size and cost of a power module can be reduced thanks to the multifunctional busbar.

Furthermore, the power module is efficiently cooled by a double sided cooling system on the entire heat exchange area with no need to additional room for electrical connection. Any type of liquid coolant can be used with no risk of short circuit between the different bars being at different voltage levels.

According to a particular feature, the first bar comprises a channel, the second bar comprises a channel, the channels being joint together by the pipe through which a liquid coolant flows.

Thus, a single coolant circuit is required.

Thus, any type of liquid coolant can be used with no risk of short circuit between the different bars being at different voltage levels.

According to a particular feature, fins are introduced in each channel or each channel is split into a plurality of sub-channels.

Thus, the heat exchange area is increased and the heat convection is increased between liquid coolant and cooler without increasing the pressure drop inside the channels.

According to a particular feature, the inner surface of the channels have a surface treatment.

Thus, the heat convection between the cooler and the coolant is increased.

According to a particular feature, the liquid cooled system is arranged to provide at least one electric power supply to a plurality of dies of power modules.

According to a particular feature, the power modules are identical and have a rectangular shape and the liquid cooled system is disposed perpendicularly to the larger side of the power modules.

Thus, a single or multiple power modules are used to build a single or multiple modular power converter composed of a similar power modules and electrically supplied by the same cooling system.

According to a particular feature, each power module is a multilayer structure formed with isolation and conductor layers and the power dies are embedded in the multilayer structure.

Thus, the power dies have low inductance connection to the conductor layers of the module.

According to a particular feature, each power module further comprises capacitors that are embedded in the multilayer structure.

Thus, the parasitic inductances of the bus capacitors are reduced and therefore the noise generated by the switching transitions of the power module are reduced.

According to a particular feature, each power module further comprises driving circuits of the power dies that are disposed on a surface of the multilayer structure or integrated completely or partially in the multilayer structure.

Thus, gate driver circuit is close to the power stage which allows increasing the switching speed and therefore reduces the switching losses of the power dies.

According to a particular feature, each power module further comprises an inductor that is located within the multilayer structure and a magnetic material that is disposed on a surface of the multilayer structure.

Thus, the tolerences between power modules are reduced in order to reduce the current disparity between modules in modular power converters.

According to a particular feature, only the part of the multilayer structure comprising the power die is cooled by the liquid cooled system.

The characteristics of the invention will emerge more clearly from a reading of the following description of an example of embodiment, the said description being produced with reference to the accompanying drawings.

DESCRIPTION OF EMBODIMENTS

Figure 1:
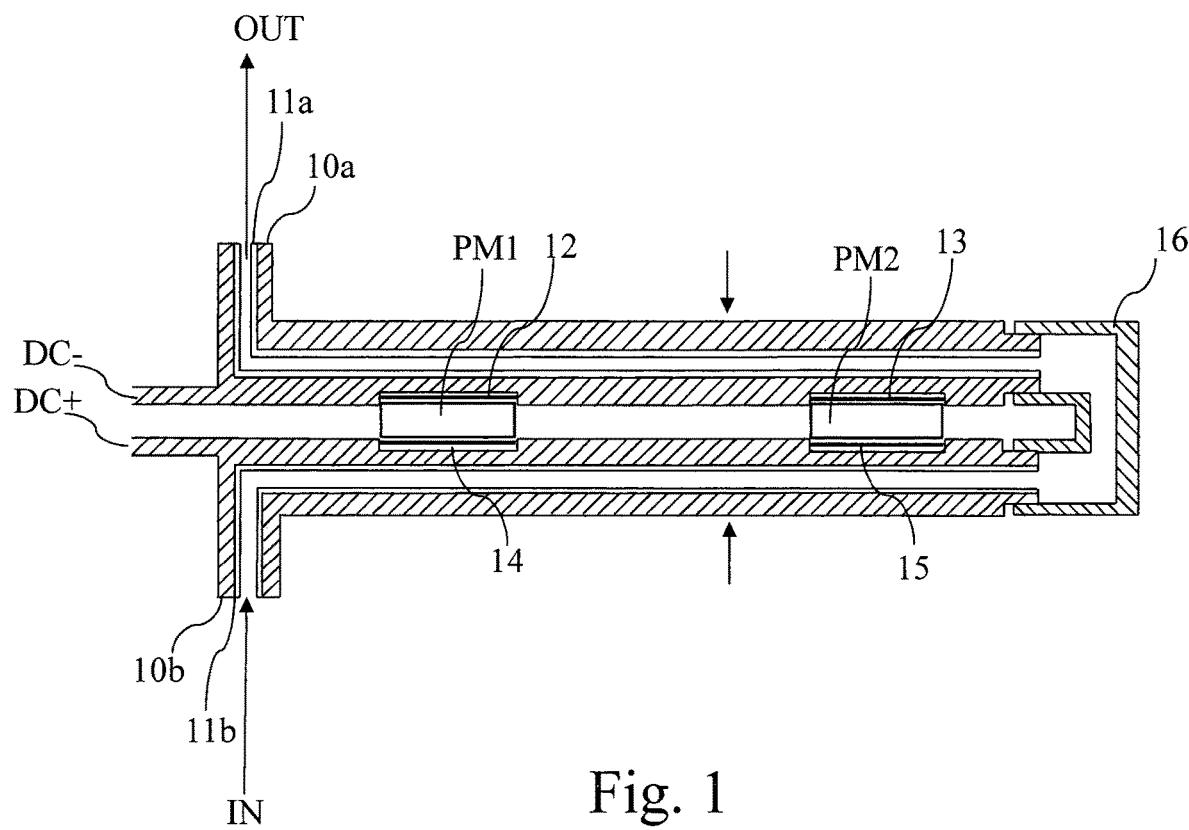
FIG. 1 is a diagram representing a first example of a section of a power module cooled by a liquid cooled busbar according to the present invention.

FIG. 1 is a diagram representing a first example of a section of a power module cooled by a liquid cooled busbar according to the invention.

In the example of FIG. 1, the liquid cooled busbar is composed of two bars 10a and 10b. The bars can be made of any good thermal and electrical conductor such as metal or alloy like for example copper, aluminium. The liquid cooled busbar comprises at least one channel, at least one inlet IN and at least one outlet OUT in order to enable the flow of the liquid coolant within the liquid cooled busbar. The channels can have fins or any surface conditions in order to improve the convection coefficient. The coolant fluid at the outlet OUT is transported to a heat exchanger not shown in FIG. 1 that can be mounted on the busbar itself or can be connected to the busbar by pipes or tubes.

The liquid cooled busbar may have any geometrical features, anchors, and/or holes in order to act as mechanical fixture to the power modules PM1 and PM2 to be cooled. According to the invention, the liquid cooled busbar has at least one electrical terminal in order to provide electric potential to the power modules PM1 and PM2. In the example of FIG. 1, the liquid cooled busbar has two electric terminals noted DC+ and DC−. The liquid cooled busbar can be made by a multilayer structure attached by any conventional technique like for example sinter, solder or adhesives. The liquid cooled busbar may also be made with other conventional techniques like mechanical machining or other.

The first bar 10a is linked to the top of power modules PM1 and PM2 through electrically and thermally conducting interface sheets 12 and 13 like Molybdenum sheets or thermal springs. The first bar 10a provides a negative DC voltage to the power modules PM1 and PM2.

The second bar 10b is linked to the bottom of power modules PM1 and PM2 through electrically and thermally conducting interface sheets 14 and 15 like Molybdenum sheets or thermal springs.

The second bar 10b provides a positive DC voltage to the power modules PM1 and PM2.

The first and second bars comprise a channel though which a coolant fluid can flow.

The first and second bars are mechanically linked using a pipe noted 16. The pipe 16 has electrical isolation property.

The coolant fluid enters into the channel of the bar 10b at IN, goes through the channel of the second bar, reaches the channel of the first bar through the pipe 16 and goes out of the liquid cooled busbar through the aperture OUT.

The coolant fluid is electrically conducting, the channel surfaces are covered by an electrical insulation layer noted 11a and 11b.

The two bars are attached to each other by electrically insulated or electrically nonconductive screws and bolts not shown in FIG. 1 in order to make a pressure and an electric contact between the bars 10a and 10b and the power modules PM1 and PM2 through the conducting interface sheets 11 to 15.

The inner 11a and 11b of the channels are coated with isolation materials that are also good thermal conductors (organic, ceramic, etc.). The coating can be made by any deposition method such as screen printing, sputtering or others. The bars 10a and 10b have one or more recess that helps mechanically stabilize the power modules.

Figure 2:
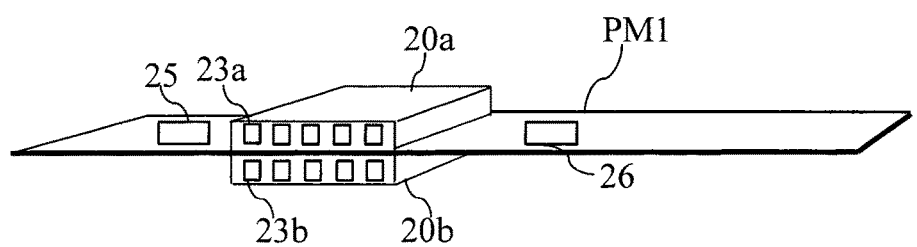
FIG. 2 is a diagram representing a power module cooled by a liquid cooled busbar according to the present invention.

FIG. 2 is a diagram representing a power module cooled by a liquid cooled busbar.

The power module, for example the power module PM1, is an assembly of two sub-modules which have a multilayer structure like PCB. Each of the sub-modules has at least one embedded semiconductor die such as SiC MOSFET, IGBT or other. The power module assembly will be disclosed in more details in reference to FIGS. 4a-4f.

Very close to the power dies which form the power stage of the power module, capacitors are embedded within the multilayer structure, i.e in the substrate of the power module as bus capacitors in order to smooth the bus voltage.

The part comprising the power dies is cooled by the liquid cooled busbar composed of two bars 20a and 20b.

In the example of FIG. 2, each bar 20a and 20b comprises one channel that is split into 5 sub-channels in order to increase the thermal exchange.

According to a variant, fins are introduced in each channel. The channel noted 23a of the bar 20a is connected to the channel 23b of the bar 20b as other channels shown in FIG. 2.

In the same multilayer structure, additional components can also be embedded like control integrated circuits noted 25, inductors, transformers, sensors, additional capacitors or resistors noted 26.

Also, embedded into the multilayer structure or mounted on the outer surface of the power modules, additional components can be attached by soldering or other to include additional or complementary functionalities to the power modules. The surfaces of the power modules above and under the power dies are made of copper with or without finishing in order to enable the bus connections of the power modules.

Figure 3:
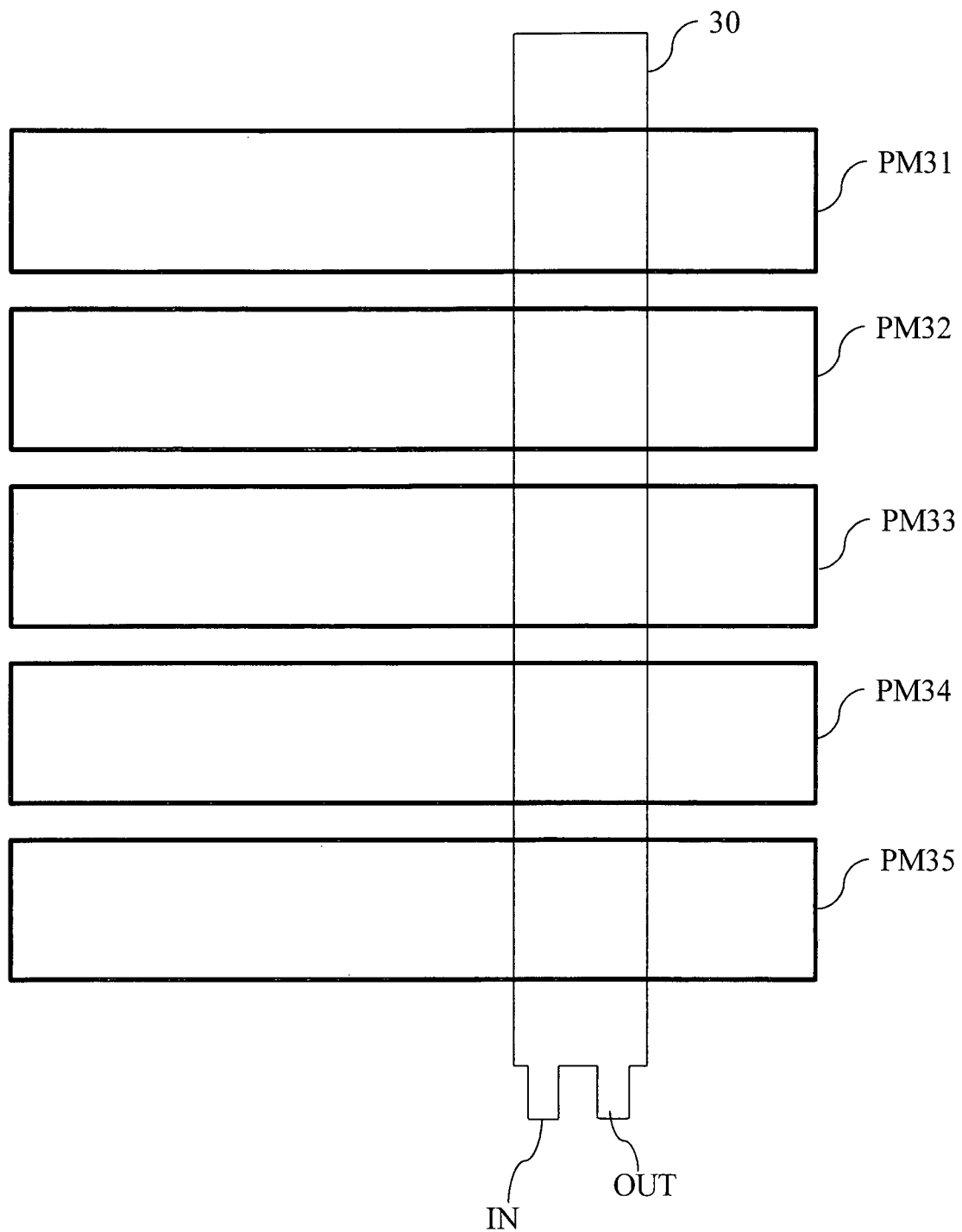
FIG. 3 is a diagram representing an assembly of power modules cooled by a liquid cooled busbar according to the present invention.

FIG. 3 is a diagram representing an assembly of power modules cooled by a liquid cooled busbar.

In the example of FIG. 3, a liquid cooled busbar 30 comprising one input and one output cools five power modules PM31 to PM35.

The liquid cooled busbar is not, as already disclosed composed of two bars but is composed in the example of FIG. 3 of a single bar that cools the power dies by from the bottom and provides at the same time a DC electric potential to the power modules PM31 to PM35.

It has to be noted here that the liquid cooled busbar may also be composed of two bars.

FIGS. 4a-4f represents different steps of the manufacturing of a power module cooled by a liquid cooled busbar.

The power module is composed of two sub-modules which have a multilayer structure like PCBs, the different steps of FIGS. 4a-4f represent the manufacturing of one of the sub-modules.

Figure 4A:
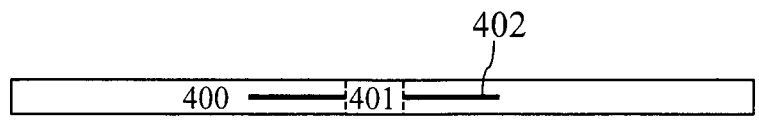
FIG. 4a represents a different step of the manufacturing of a power module cooled by a liquid cooled busbar.

The FIG. 4a represents a base layer 400 that is an electrically non-conductive and thermally conductive material. For example the base layer 400 is made of FR4. The base layer 400 is cut, for example by laser cut, in order to form a cavity of the size of a power die 401. The power die 401 is then placed in the cavity. The base layer may be divided in two or several layers separated by at least one higher thermally conductive layer 402 such as metals like copper in order to increase heat spreading.

Figure 4B:
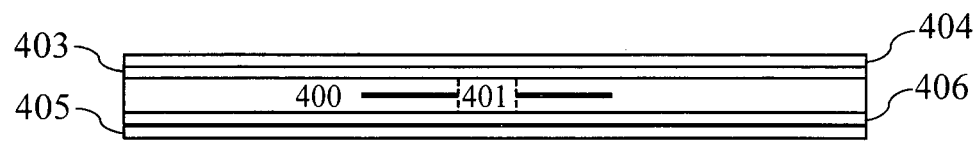
FIG. 4b represents a different step of the manufacturing of a power module cooled by a liquid cooled busbar.

The FIG. 4b represents the base layer 400 and the power die 401 on which a thin isolation layer 403 is laminated on the top of the base layer 400 and a thin isolation layer 406 is laminated on the bottom of the base layer 400. Furthermore, electrically conducting layers 404 and 405, for example made of copper, are laminated on the thin isolation layers 403 and 406. It has to be noted here that the same operation is performed of the other sub-module.

Figure 4C:
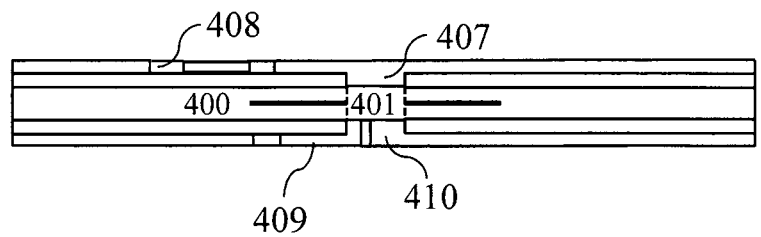
FIG. 4c represents a different step of the manufacturing of a power module cooled by a liquid cooled busbar.

The FIG. 4c represents the next step of the power module manufacturing.

Laser drilling and metallization 407, 409 and 410 are then made in order to connect the power die 401 to the conductor layer. The power die contact to the conductor layers can cover completely the power die top and bottom surface or partially by using multiple via connections or other shapes. Afterwards, the conductor layers are etched, for example by a chemical or a mechanical process in order to obtain the desired layout on the thin conductor layer.

Figure 4D:
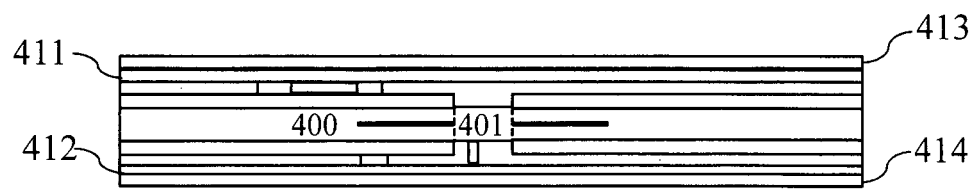
FIG. 4d represents a different step of the manufacturing of a power module cooled by a liquid cooled busbar.

The FIG. 4d represents the next step of the power module manufacturing.

Additional thin isolation layers 411 and 412 and a thick conductor layers 413 and 414 are laminated on both sides of the assembly as obtained in FIG. 4c.

Figure 4E:
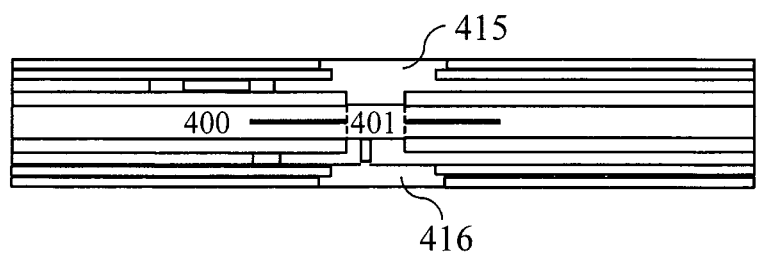
FIG. 4e represents a different step of the manufacturing of a power module cooled by a liquid cooled busbar.

The FIG. 4e represents the next step of the power module manufacturing.

Once again, laser drilling and metallization (415 and 416) are then made in order to connect the thin conductors layers 404 and 405 and the thick conductor layers 413 and 414. The connection can be made through multiple via connections or through other shapes like metallized copper squares. The conductor layers are etched in order to obtain the desired layout on layers 413 and 414. Note that in some particular cases where the conductor layers 413 and 414 are very thick, they can be pre-etched before lamination.

Figure 4F:
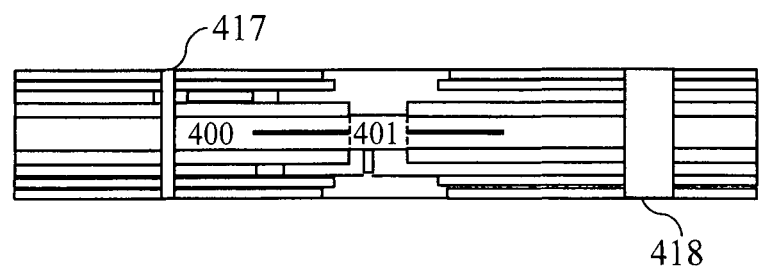
FIG. 4f represents a different step of the manufacturing of a power module cooled by a liquid cooled busbar.

The FIG. 4f represents the next step of the power module manufacturing.

Through hole vias 417 are made by drilling then metallizing. Also, board machining or drilling is performed in order to place capacitors 418 and magnetic materials.

It has to be noted here that in the example of FIG. 4, each sub-module is formed by two thin and two thick conductor layers. However, in the general case, the lamination steps of conductors and insulation layers can be repeated until the required number of conductor layers is reached.

The two sub-modules are then assembled with thermally and electrically conductive materials.

External component soldering, attachment and magnetic material moulding is performed after the assembly of two submodules.

The capacitor is connected after assembling the two sub-modules between the top layer of the top submodule and the bottom layer of the bottom sub-module.

The first part of the inductor is made on the first submodule and the second part is made on the second sub-module.

Figure 5:
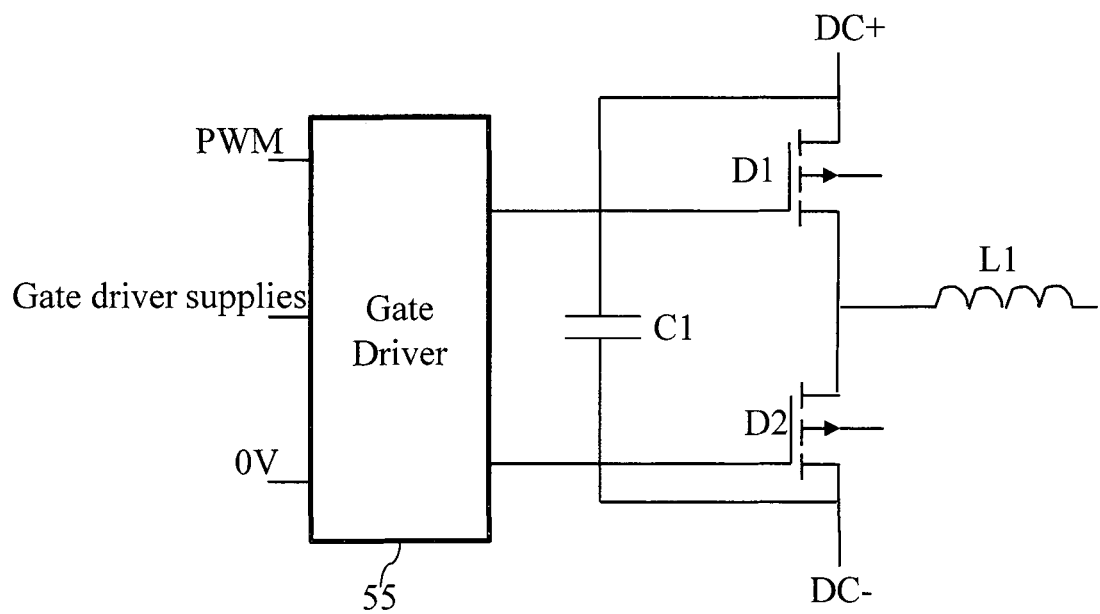
FIG. 5 represents an electric circuit of a power module cooled by a liquid cooled busbar.

FIG. 5 represents an example of an electric circuit of a power module that can be cooled by a liquid cooled bulbar.

Each power module comprises a gate driver that provides gate signals to the power dies D1 and D2.

The drain of the power die D1 is connected to the positive electric potential DC+ provided by the liquid cooled busbar. The source of the power die D1 is connected to the drain of the power die D2 and to a first terminal of an inductor L1.

The source of the power die D2 is connected to the negative electric potential DC− provided by the liquid cooled busbar.

The second terminal of the inductor L1 is the output of the power module.

Naturally, many modifications can be made to the embodiments of the invention described above without departing from the scope of the present invention.

The invention claimed is:

1. A system comprising at least one power module comprising at least one power die that is cooled by a liquid cooled system, the liquid cooled system is arranged to provide at least one electric potential to each power dies of the power module, wherein the liquid cooled system is composed of a first and a second current-carrying bars connected together by an electrically non-conductive pipe, the first bar is placed on the top of the power module and provides a first electric potential to the power die and the second bar is placed on the bottom of the power module and provides a second electric potential to the power dies, the liquid coolant is electrically conductive and the channels surfaces are covered by an electrical insulation layer.

2. The system according to claim 1, wherein the first bar comprises a channel, the second bar comprises a channel, the channels being joint together by the electrically non-conductive pipe through which a liquid coolant flows.

3. The system according to claim 1, wherein fins are introduced in each channel or each channel is split into a plurality of sub-channels.

4. The system according to claim 2, wherein an inner surface of the channels has a surface treatment.

5. The system according to claim 1, wherein the liquid cooled system is arranged to provide at least one electric power supply to a plurality of dies of power modules.

6. The system according to claim 5, wherein the power modules are identical and have a rectangular shape and in that the liquid cooled system is disposed perpendicularly to the larger side of the power modules.

7. The system according to claim 5, wherein each power module is a multilayer structure formed with isolation and conductor layers and the power dies are embedded in the multilayer structure.

8. The system according to claim 7, wherein each power module further comprises capacitors that are embedded in the multilayer structure.

9. The system according to claim 8, wherein each power module further comprises driving circuits of the power dies that are disposed on a surface of the multilayer structure or integrated completely or partially in the multilayer structure.

10. The system according to claim 9, wherein each power module further comprises an inductor that is located within the multilayer structure and a magnetic material that is disposed on a surface of the multilayer structure.

11. The system according to claim 10, wherein only the part of the multilayer structure comprising the power die is cooled by the liquid cooled system.

* * * * *